United States Patent
Hu et al.

(10) Patent No.: US 10,998,443 B2
(45) Date of Patent: May 4, 2021

(54) EPI BLOCK STRUCTURE IN SEMICONDUCTOR PRODUCT PROVIDING HIGH BREAKDOWN VOLTAGE

(71) Applicant: TAIWAN SEMICONDUCTOR MANUFACTURING CO., LTD., Hsinchu (TW)

(72) Inventors: Chia-Hsin Hu, Changhua (TW); Huan-Tsung Huang, Changhua (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/130,205

(22) Filed: Apr. 15, 2016

(65) Prior Publication Data
US 2017/0301785 A1 Oct. 19, 2017

(51) Int. Cl.
*H01L 29/78* (2006.01)
*H01L 29/66* (2006.01)
*H01L 29/08* (2006.01)

(52) U.S. Cl.
CPC ........ *H01L 29/785* (2013.01); *H01L 29/0847* (2013.01); *H01L 29/66795* (2013.01); *H01L 29/7848* (2013.01)

(58) Field of Classification Search
CPC ............ H01L 29/66795; H01L 29/785; H01L 27/0886; H01L 29/6656; H01L 27/1211; H01L 29/41791; H01L 29/41775–41791
See application file for complete search history.

(56) References Cited

U.S. PATENT DOCUMENTS

| | | | | |
|---|---|---|---|---|
| 6,197,648 | B1* | 3/2001 | Kasai | H01L 29/665 257/E21.438 |
| 9,054,130 | B2* | 6/2015 | Peng | H01L 21/30608 |
| 9,722,081 | B1* | 8/2017 | Tsai | H01L 21/2236 |
| 9,905,474 | B2* | 2/2018 | Liang | H01L 21/823814 |
| 10,312,084 | B2* | 6/2019 | Chen | H01L 21/0335 |
| 2004/0180504 | A1* | 9/2004 | Lee | H01L 21/82345 438/303 |
| 2005/0079655 | A1* | 4/2005 | Chen | H01L 21/28247 438/140 |
| 2005/0130434 | A1* | 6/2005 | Chien | C30B 25/18 438/706 |

(Continued)

*Primary Examiner* — Stephen M Bradley
(74) *Attorney, Agent, or Firm* — Sterne, Kessler, Goldstein & Fox P.L.L.C.

(57) ABSTRACT

The present disclosure is generally directed to semiconductor structures and methods that improve breakdown characteristics in finFET device designs, while retaining cost effectiveness for integration into the process flow. The semiconductor structure includes an extended lightly-doped-drain (LDD) region formed on a source/drain structure. The extended LDD regions provide extra separation between source and drain regions, which in turn provides for an increased source to drain resistance. The increased source to drain resistance improves the breakdown voltage of the semiconductor device, and significantly reduces its susceptibility to latch-up. The source to drain resistance may be tuned by adjusting the length of epi block regions, and may also be tuned by selecting desired doping profiles for the LDD and source/drain regions. The length of epi block regions may also be adjusted to maintain high uniformity of epitaxial growth in the S/D regions.

17 Claims, 7 Drawing Sheets

(56) References Cited

U.S. PATENT DOCUMENTS

| | | | |
|---|---|---|---|
| 2008/0185650 A1* | 8/2008 | Chen | H01L 29/66795 257/348 |
| 2008/0224203 A1* | 9/2008 | Kim | H01L 29/1083 257/327 |
| 2010/0164021 A1* | 7/2010 | Cho | H01L 21/2822 257/408 |
| 2011/0227157 A1* | 9/2011 | Yang | H01L 21/76232 257/347 |
| 2011/0278676 A1* | 11/2011 | Cheng | H01L 21/823807 257/369 |
| 2012/0104470 A1* | 5/2012 | Ponoth | H01L 29/66545 257/288 |
| 2012/0126296 A1* | 5/2012 | Huang | H01L 29/66628 257/288 |
| 2012/0199905 A1* | 8/2012 | Nitta | H01L 29/0865 257/343 |
| 2012/0225545 A1* | 9/2012 | Fu et al. | H01L 29/66545 438/585 |
| 2013/0200449 A1* | 8/2013 | Chen | H01L 21/823431 257/296 |
| 2013/0235652 A1* | 9/2013 | Liaw | H01L 27/0207 365/156 |
| 2015/0091086 A1* | 4/2015 | Lu | H01L 29/7833 257/336 |
| 2015/0132909 A1* | 5/2015 | Choi | H01L 29/66803 438/283 |
| 2015/0187915 A1* | 7/2015 | Joo | H01L 29/66803 438/289 |
| 2016/0118469 A1* | 4/2016 | Chen | H01L 21/823443 257/412 |
| 2016/0163850 A1* | 6/2016 | Liu et al. | H01L 29/41758 257/338 |
| 2016/0181383 A1* | 6/2016 | Huang | H01L 29/41758 257/757 |
| 2016/0190137 A1* | 6/2016 | Tsai | H01L 27/0924 257/369 |
| 2016/0211365 A1* | 7/2016 | Shea | H01L 29/0634 |
| 2016/0240644 A1* | 8/2016 | Muller | H01L 27/0727 |
| 2016/0247881 A1* | 8/2016 | Cooper | H01L 29/66795 |
| 2016/0300904 A1* | 10/2016 | Antoniou | H01L 29/404 |
| 2017/0005002 A1* | 1/2017 | Ching | H01L 21/823412 |
| 2017/0069547 A1* | 3/2017 | Peng | H01L 21/823864 |
| 2017/0077233 A1* | 3/2017 | Zhang | H01L 29/1083 |
| 2017/0194493 A1* | 7/2017 | Kwon | H01L 29/7833 |
| 2017/0243954 A1* | 8/2017 | Li | H01L 29/66795 |
| 2017/0263765 A1* | 9/2017 | Kosier | H01L 23/535 |
| 2018/0315855 A1* | 11/2018 | Peng | H01L 21/30608 |

* cited by examiner

US 10,998,443 B2

1

EPI BLOCK STRUCTURE IN SEMICONDUCTOR PRODUCT PROVIDING HIGH BREAKDOWN VOLTAGE

BACKGROUND

Many developments in both semiconductor structures and manufacturing processes have contributed to reducing the size and increasing the performance of integrated circuits. One recent advance in semiconductor structures has been the introduction of a transistor structure referred to as a finFET. FinFET transistors typically have advantages such as higher drain currents, higher switching speeds, lower switching voltages, and lower leakage currents.

Integrated circuits often include electrical components in addition to transistors, such as, for example, diodes, capacitors, and resistors, each of which may be combined with FinFETs to form an electrical circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
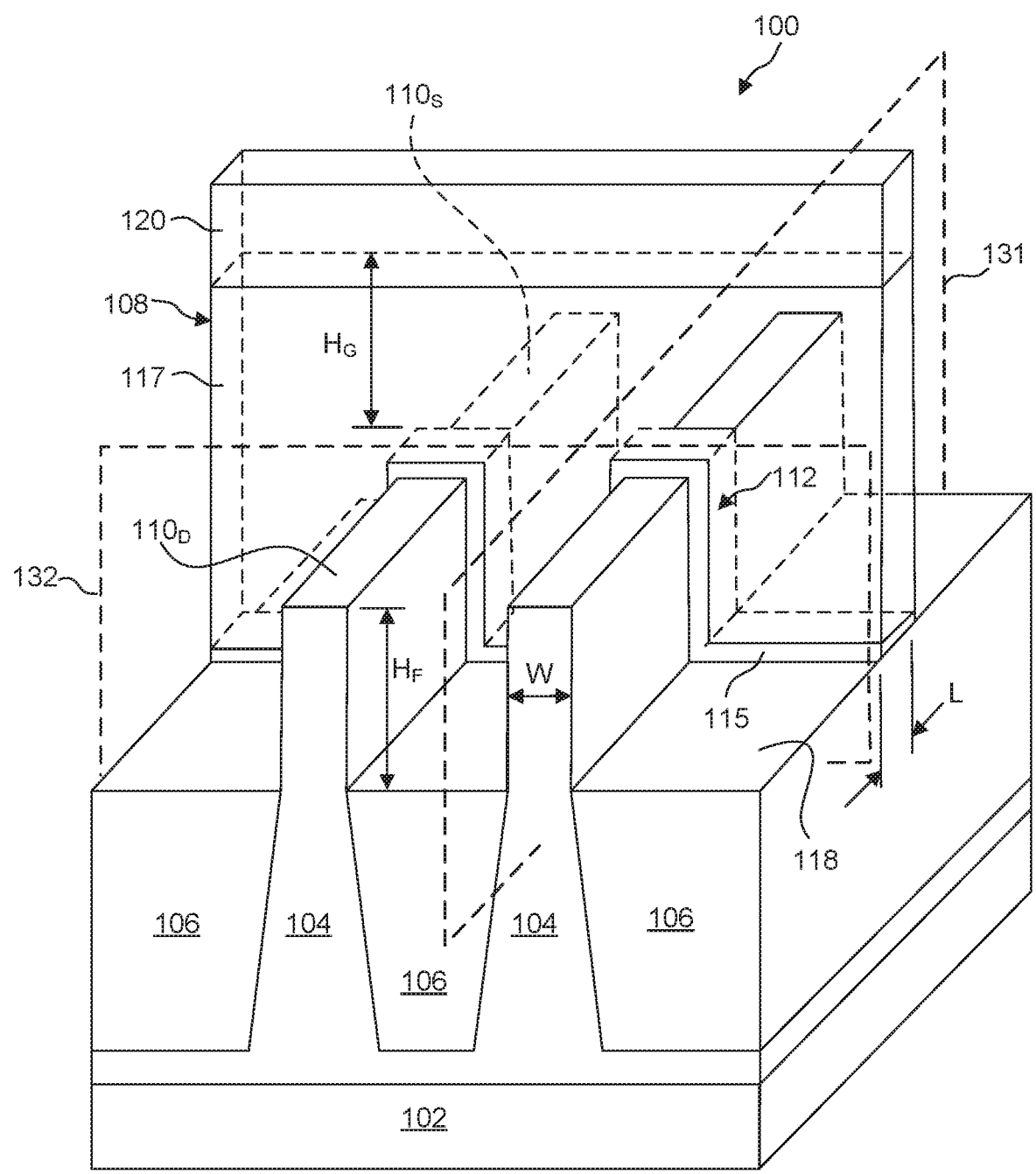
FIG. 1A is an isometric view of an example semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. A very common type of FET is referred to as a metal oxide semiconductor field effect transistor (MOSFET). Historically, MOSFETs have been planar structures built in and on the planar surface of a substrate such as a semiconductor wafer. But recent advances in semiconductor manufacturing have resulted in the use vertical structures.

The term "finFET" refers to a FET that is formed over a fin that is vertically oriented with respect to the planar surface of a wafer.

S/D refers to the source and/or drain junctions that form two of the four terminals of a FET.

The expression "epitaxial layer" herein refers to a layer or structure of single crystal material. Likewise, the expression "epitaxially grown" herein refers to a layer or structure of single crystal material. Epitaxially grown material may be doped or undoped.

The expression "high-k" refers to a high dielectric constant. For example, high-k refers to a dielectric constant that is greater than the dielectric constant of $SiO_2$ (i.e., greater than 3.9).

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "vertical," as used herein, means nominally perpendicular to the surface of a substrate.

Overview

Various embodiments in accordance with this disclosure provide improved S/D resistance compared with conventional finFET processes and structures. Specifically, S/D resistance may be increased by having a horizontal separation between the source/drain regions and gate sidewalls. Having a greater S/D resistance may provide for increased breakdown voltage and reduced reverse current which in turn provides for improved transistor performance. By suitably adjusting device parameters, performance enhancements are achieved while maintaining high epitaxial growth uniformity.

Before describing the embodiments related to the design of the S/D regions of a finFET, an example fabrication process for a finFET is presented. FIGS. 1-3 provide various views of a semiconductor device that includes finFETs during various stages of fabrication. The fabrication process provided here is exemplary, and many other steps may be performed that are not shown in these figures.

Illustrated in FIG. 1A is perspective view of a semiconductor device structure 100. A semiconductor device structure 100 includes finFET device structures. Semiconductor device structure 100 includes a substrate 102, a plurality of fins 104, a plurality of isolation structures 106, and a gate structure 108 that is disposed over the sidewalls and top surface of each of fins 104. Gate structure 108 includes a gate dielectric layer 115, and a gate electrode layer 117. In alternative embodiments, one or more additional layers may be included in gate structure 108. FIG. 1A, shows a hard mask 120 disposed on a top surface of gate electrode layer 117. Hard mask 120 is used to pattern, such as by etching, gate structure 108. In some embodiments, hard mask 120 is made of a dielectric material, such as silicon oxide. The perspective view of FIG. 1A is taken after the patterning process (e.g., etching) of gate structure 108. FIG. 1A shows only one gate structure 108. Those skilled in the art will understand that typical integrated circuits contain a plurality of such, and similar, gate structure(s).

Each of the plurality of fins 104 shown in FIG. 1A includes a pair of S/D terminals. For ease of description, a first one of the pair of S/D terminals is referred to as a source region $110_S$ and a second one of the pair of S/D terminals is referred to as a drain region 110, where S/D terminals are formed in, on, and/or surrounding fin 104. A channel region 112 of fin 104 underlies gate structure 108. Gate structure 108 has a gate length L, and a gate width ($2 \times H_F + W$), as shown in FIG. 1A. In some embodiments, the gate length L is in a range from about 10 nm to about 30 nm. In some other embodiments, the gate length L is in a range from about 3 nm to about 10 nm. In some embodiments, the fin width W is in a range from about 10 nm to about 20 nm. In some other embodiments, the fin width W is in a range from about 3 nm to about 10 nm. Gate height $H_G$ of gate structure 108, measured from the top of fin 104 to the top of gate structure 108, is in a range from about 50 nm to about 80 nm, in some embodiments. Fin height $H_F$ of fin 104, measured from the surface of isolation structure 106 to the top of fin 104, is in a range from about 25 nm to about 35 nm, in some embodiments.

Substrate 102 may be a silicon substrate. Alternatively, substrate 102 may comprise another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, substrate 102 is a semiconductor on insulator (SOI).

Isolation structures 106 are made of a dielectric material and may be formed of silicon oxide, silicon nitride, silicon oxynitride, fluorine-doped silicate glass (FSG), a low-k dielectric material, and/or other suitable insulating material. Isolation structures 106 may be shallow trench isolation (STI) structures. In an embodiment, the isolation structures are STI structures and are formed by etching trenches in substrate 102. The trenches may then be filled with insulating material, followed by a chemical mechanical polish (CMP). Other fabrication techniques for isolation structures 106 and/or fin 104 are possible. Isolation structures 106 may include a multi-layer structure, for example, having one or more liner layers.

Fins 104 are active regions where one or more transistors are formed. Fin 104 may comprise silicon or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to protect regions of the substrate while an etch process forms recesses into isolation structures 106, leaving protruding fins. The recesses may be etched using reactive ion etch (RIE) and/or other suitable processes. Numerous other methods to form fins 104 on substrate 102 may be suitable.

Gate structure 108 may include a gate dielectric layer 115, a gate electrode layer 117, a spacer layer 116, and/or one or more additional layers. For ease of description, spacer layer 116 is not shown in FIG. 1A. In an embodiment, gate structure 108 uses polysilicon as gate electrode layer 117. Also shown in FIG. 1A is a hard mask 120 disposed on a top surface of gate electrode layer 117. Hard mask 120 is used to pattern, such as by etching, gate structure 108. In some embodiments, hard mask 120 is made of a dielectric material, such as silicon oxide.

Although the perspective view of FIG. 1A shows gate structure 108 using polysilicon as the gate electrode layer 117, those skilled in the art will understand that gate structure 108 may be a sacrificial gate structure such as formed in a replacement gate process used to form a metal gate structure. The replacement gate process and many other steps may be performed and are not shown in these figures. The metal gate structure may include interfacial layer(s), gate dielectric layer(s), work function layer(s), fill metal layer(s) and/or other suitable materials for a metal gate structure. In other embodiments, the metal gate structure may further include capping layers, etch stop layers, and/or other suitable materials. The interfacial layer may include a dielectric material such as a silicon oxide layer ($SiO_2$) or silicon oxynitride (SiON). The interfacial dielectric layer may be formed by chemical oxidation, thermal oxidation, atomic layer deposition (ALD), chemical vapor deposition (CVD), and/or other suitable formation process.

Exemplary p-type work function metals that may be included in the metal gate structure include TiN, TaN, Ru, Mo, Al, WN, ZrSi2, MoSi2, TaSi2, NiSi2, WN, other suitable p-type work function materials, or combinations thereof. Exemplary n-type work function metals that may be included in the metal gate structure include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, physical vapor deposition (PVD), and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the sacrificial gate structure.

Semiconductor device structure 100 described above includes fins 104 and gate structure 108. The semiconductor device structure 100 needs additional processing to form various features, such as lightly-doped-drain (LDD) regions and doped source/drain structures, of the transistor utilizing structure 100. LDD regions are formed in fins 104 by doping, and the term LDD regions is used to describe lightly doped regions disposed between the channel region of a transistor and a least one of the transistor's source/drain regions. Ion implantation has been used as a doping process for many technology nodes. Embodiments in accordance with the present disclosure are not limited to ion implantation as the doping process for LDD regions.

Figure 1B:
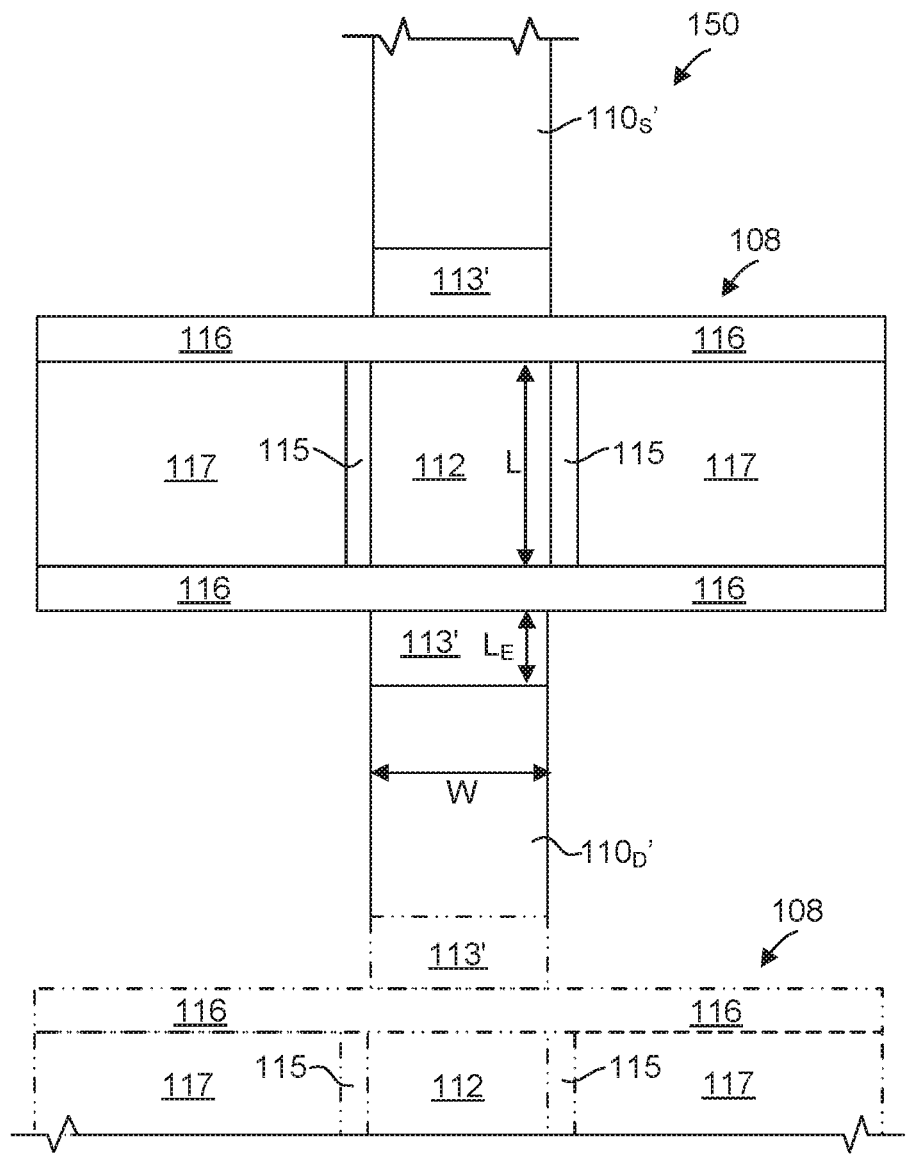
FIG. 1B shows a top view of an example transistor region, in accordance with some embodiments.

FIG. 1B shows a top view of a transistor region 150 formed with one of the fins 104 of FIG. 1A and taken on a surface level with the top surface 118 of isolation structure 106. Transistor region 150 includes a doped source/drain regions $110_S'$ and $110_D'$, which have the same cross-sections as doped source/drain regions $110_S$ and $110_D$ respectively, of FIG. 1A at surface 118.

Transistor region 150 also includes a channel region 112, which is part of fin 104 and is surrounded by gate structure 108 on three sides, as shown in FIG. 1A. The channel region 112 underlies the gate structure 108 and has a width (fin width) W. Depending on fabrication processing conditions and device designs, the length of channel region 112 may be slightly different from gate length L. Solely for the ease of description, the length of channel region 112 is denoted as gate length L. Transistor region 150 also includes gate dielectric layer 115 and gate electrode layer 117. FIG. 1B also shows spacers 116 formed on gate structures 108. Partial LDD regions 113' are formed in the top surface and side walls of fin 104, and may be located between source/drain region $110_S$, and spacer 116, and also between source/drain region $110_D$, and spacer 116. The portion of partial LDD region 113' that is shown in FIG. 1B has a width W and a length $L_E$. FIG. 1B also shows another gate structure 108 by dotted lines. This other gate structure 108 has been described above as being similar and parallel to the gate structure 108 and is not shown in FIG. 1A.

Referring to FIGS. 2A through 2E, various perspective and cross-sectional views of a finFET at various stages of fabrication according to various illustrative embodiments of the present disclosure are shown.

Figure 2A:
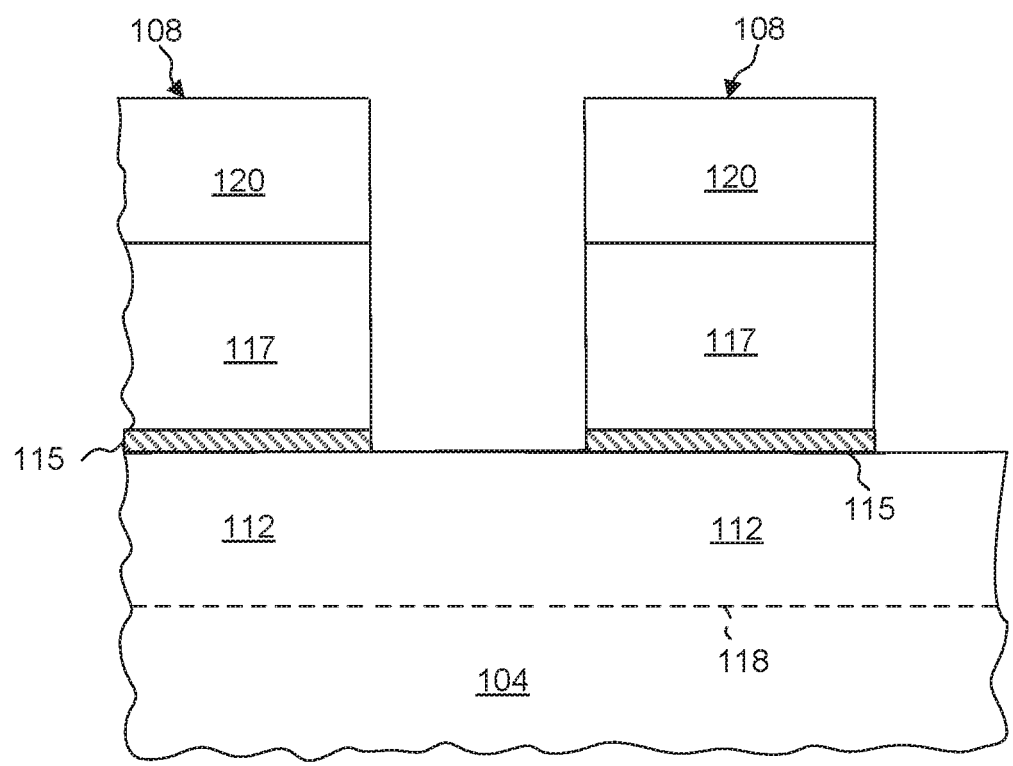
FIGS. 2A-2E show cross-sectional views of a partially fabricated finFET after each of a series processing steps of an example transistor region, in accordance with some embodiments.

FIG. 2A shows two neighboring gate structures 108 formed over fin 104, according to the cut 131 illustrated in FIG. 1A. Each gate structure 108 includes a gate electrode 117 and a gate dielectric 115. A hard mask 120 is shown disposed over gate electrodes 117. In some embodiments, hard mask 120 is used to define the patterning of gate electrodes 117. Hard mask 120 comprises any suitable material, including but not limited to, silicon nitride, SiON, SiC, SiOC, spin-on glass (SOG), a low-k film, tetraethoxysilane (TEOS), plasma enhanced CVD oxide (PE-oxide), high-aspect-ratio-process (HARP) formed oxide, and/or other suitable material. Channel regions 112, which are directly under the gate structures 108 are also noted in FIG. 2A. A dotted line 118 indicates the level of surfaces of isolation regions 106.

Figure 2B:
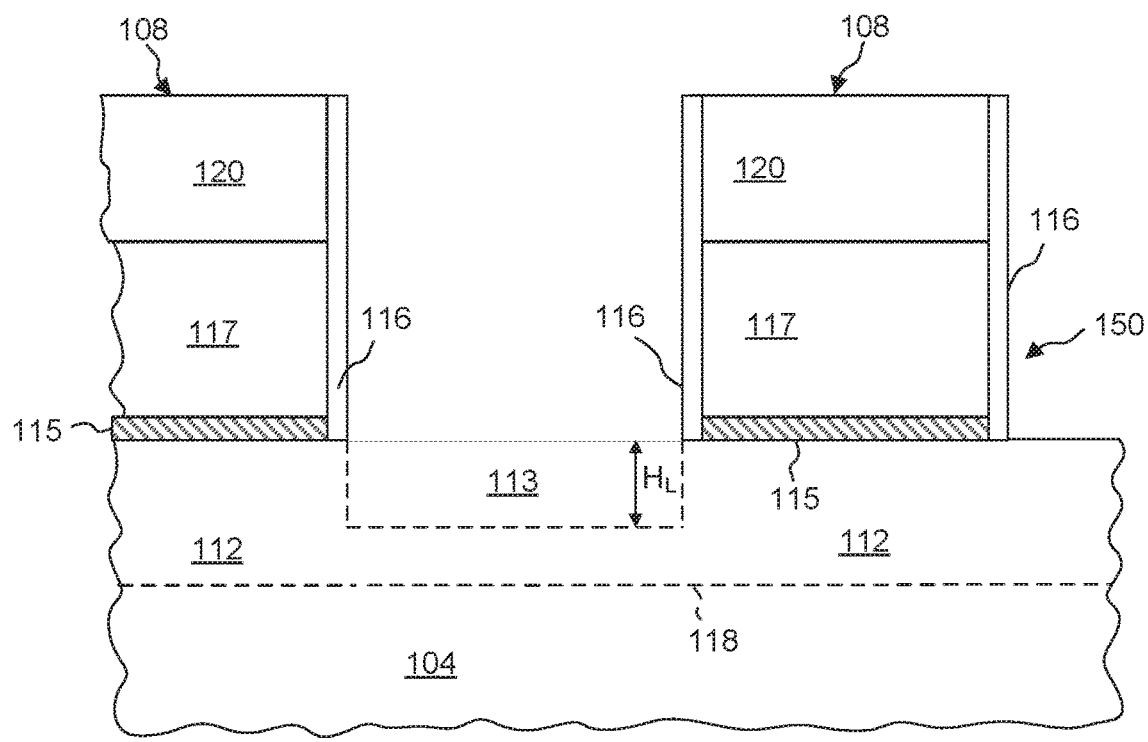

FIG. 2B shows a doping mechanism to provide sufficient dopant level for the LDD regions 113, according to the cut 131 illustrated in FIG. 1A. To dope LDD regions 113 by implant, a spacer layer 116 is deposited to cover gate structures 108 (which have a hard mask layer 120 over the structures), and exposes surfaces of fins 104 between adjacent gate structures 108, as shown in FIG. 2B. Spacers 116 may be formed using an etch-back technique where a blanket deposition of material is etched, leaving the material along the sidewalls of gate structures 108. Spacer layer 116 is made of a dielectric material, such as silicon oxide, silicon oxynitride (SiON), or silicon nitride (SiN). In some embodiments, the deposition process is a plasma-enhanced chemical vapor deposition (PECVD) process. Other applicable deposition processes may also be used. In some embodiments, the thickness of spacer layer 116 is in a range from about 2 nm to about 4 nm. Spacer layer 116 provides an offset distance, which is the thickness of spacer layer 116, from channel region 112 and prevents the dopants from being implanted in the channel region 112. Therefore spacer layer 116 may also be called an offset spacer layer.

Lightly-doped-drain (LDD) regions 113 are then formed in the fin structure between adjacent spacers 116. An ion implant process is performed to form LDD regions 113, and may utilize any suitable doping species. Although LDD regions 113 are shown as only being close to the top surface of fin 104, LDD regions 113 may actually be close to both the top surface and sidewalls of fin 104. The LDD implantation may be performed vertically, or tilted toward the sidewalls of fin 104. Depending on the implantation process, LDD regions 113 may extend to a certain depth below the surfaces of fin 104. For example, LDD region 113 may extend to a depth of $H_L$ below the top surface of fin 104, as shown in FIG. 2B. It will be understood by those skilled in the art and having the benefit of this disclosure that the LDD region may also extend from the sidewall surfaces of fin 104 into the interior of fin 104. Substrate 102 could have both p-type and n-type devices. Additional processes, such as lithography patterning processes, would be involved to protect the p-type device regions from dopant ions for n-type devices. The processing sequence involved in forming and doping the p-type devices are well known to those of ordinary skill in the art and are not further described in this disclosure.

After the dopant ions are implanted, a thermal anneal is performed to drive in and to activate the dopants. The thermal anneal may utilize rapid thermal processing (RTP) anneal, spike anneal, millisecond anneal, or laser anneal. Spike anneal operates at peak anneal temperature for a time period on the order of seconds. Millisecond anneal operates at peak anneal temperature for a time period on the order of milliseconds, and laser anneal operates at peak anneal temperature for a time period on the order of microseconds.

Figure 2C:
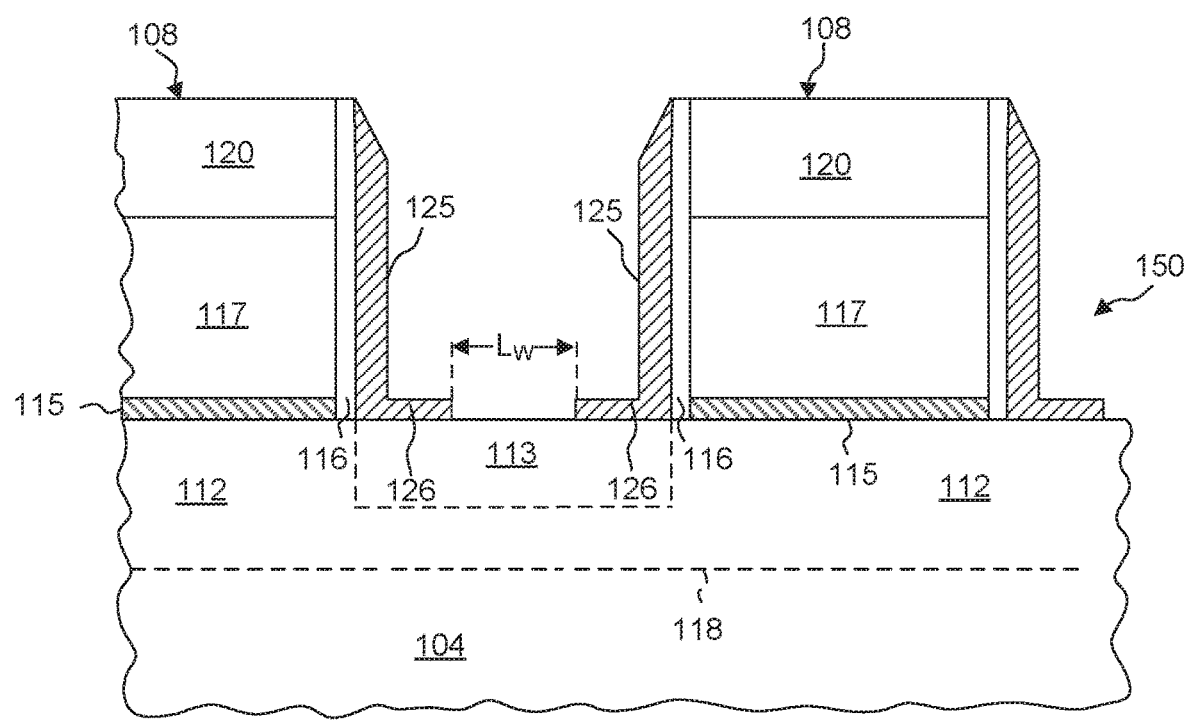

FIG. 2C shows epi block layer 125 formed over semiconductor device structure 100, according to the cut 131 illustrated in FIG. 1A. Epi block layer 125 is formed over a top surface of gate structure 108 and spacers 116, and over the surface of LDD region 113. Epi block layer 125 has a thickness sufficient to protect gate structure 108, spacers 116 and LDD region 113 during subsequent etching of fin 104. Epi block layer 125 has a thickness in a range from about 5 nm to about 10 nm. Epi block layer 125 is made of a dielectric material, such as silicon oxynitride (SiON), silicon nitride (SiN), or carbon-doped silicon nitride (SiCN). SiCN has relatively low etch rate against etchants, such as $H_3PO_4$ and HF, in comparison to SiN or SiON. In some embodiments, the deposition process is a plasma-enhanced chemical vapor deposition (PECVD) process. Other applicable deposition processes may also be used. In some embodiments, each of spacers 116 has a width in a range from about 5 nm to about 10 nm. In some embodiments, epi block layer 125 comprises a photoresist layer.

A material removal process is then performed to remove epi block layer 125 that has been formed over hard mask layer 120 and also over other a portion of horizontal surfaces of substrate 102. The process leaves spacer layer 116 and at least a portion of epi block layer 125 on the side walls of gate structures 108, and hard mask layer 120 over gate structures 108. The process removes at least a portion of epi block layer 125 that is formed on fin 104 and between adjacent spacers 116. As a result, this portion of epi block layer 125 forms epi block region 126. FIG. 2C shows that epi block layer 125 has been formed and partially removed. In some embodiments, the horizontal length $L_E$ of epi block region 126 between the vertical edge of gate structure 108 and the edge of revealed LDD region 113 is in the range of 50 nm and 150 nm. In some embodiments, the horizontal length $L_W$ between edges of adjacent epi block regions 126 is in the range of 50 nm and 350 nm. Epitaxial block region 126 protects its covered portion of LDD region 113 during a subsequent recess etching process of fin 104.

Epi block region 126 can be formed by any suitable material removal process including various photolithography and/or etching processes. In embodiments where epi block layer 125 comprises a dielectric layer, an exemplary photolithography process includes forming a photoresist layer overlying epi block layer 125, exposing the resist to a pattern, performing a post-exposure bake process, and developing the resist to form a masking element including the resist. The area of epi block layer 125 that is not protected by the masking element is etched using, for example, a reactive ion etching (RIE) processes and/or other suitable processes. The photoresist layer is subsequently removed by any suitable resist strip process. In embodiments where epi block layer 125 comprises a photoresist layer, an exemplary photolithography process includes exposing the photoresist layer to a pattern, performing a post-exposure bake process, and developing the photoresist layer to form epi block region 126.

Figure 2D:
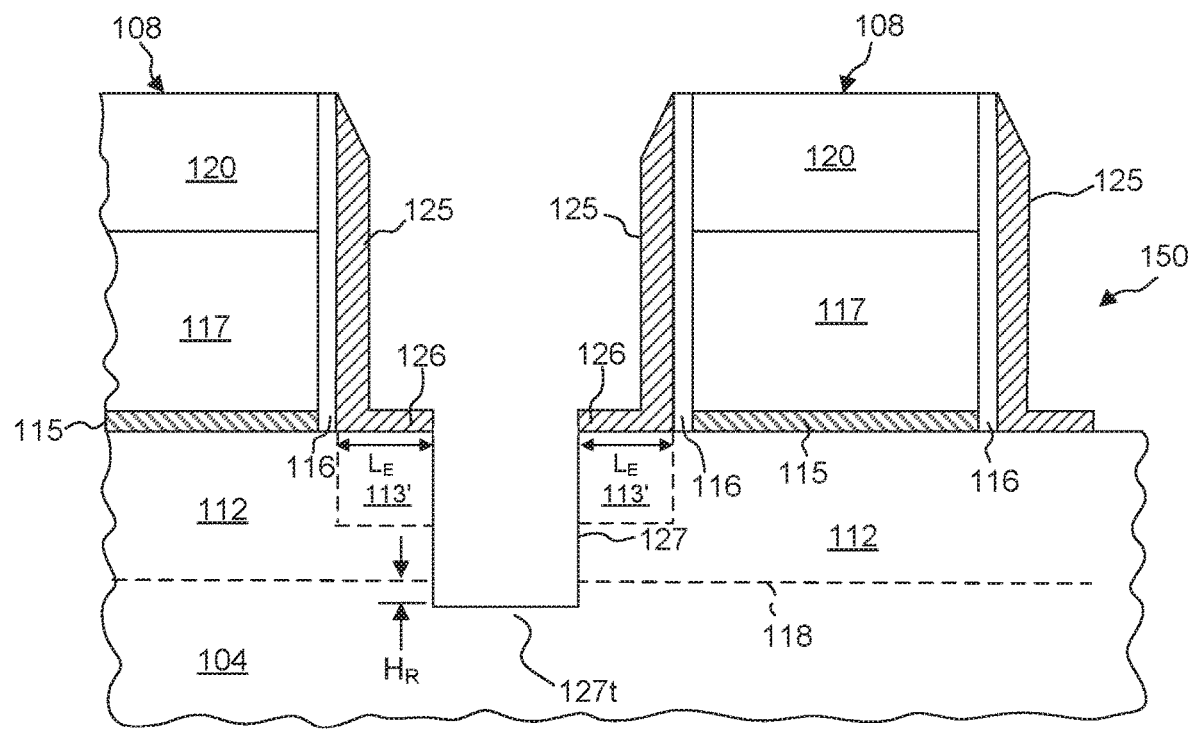

FIG. 2D shows recess 127 formed in the fin between neighboring gate structures 108, according to the cut 131 illustrated in FIG. 1A. The portion of LDD region 113 that is not protected by epi block region 126 is etched using reactive ion etching (RIE) processes and/or other suitable processes. Width of the partial LDD region 113' that is between recess 127 and spacer 116 is therefore determined by $L_E$ of epi block region 126. An illustrative fin etching process may be performed under a pressure of about 1 mTorr to about 1000 mTorr, a power of about 50 W to about 1000 W, a bias voltage of about 20 V to about 500 V, at a temperature of about 40° C. to about 60° C., and using HBr and/or $Cl_2$ as etch gases. Also, the bias voltage used in the illustrative etching process may be tuned to allow better control of an etching direction to achieve desired profiles for recess 127. In some embodiments, recess 127 may be formed to have either an angular or rounded shape at its bottom. Recess 127 has bottom surface 127t. Bottom surface 127t is below the flat top surfaces 118 of isolation structure 106. In another embodiment, bottom surface 127t is above the flat top surfaces 118 of isolation structures 106. Therefore, during the formation of recess 127 at this step, epi block region 126 is used as a natural hard mask such that a portion of LDD region 113 is protected from the etching process. This process forms partial LDD regions 113', and recess 127 is self-aligned with the opening formed by epi block region 126. The depth $H_R$ of recesses 127 below surface 118 of isolation structures 106 is in a range from about 10 nm to about 20 nm. The recesses 127 may be formed to have either an angular or rounded shape at their bottoms.

Figure 2E:
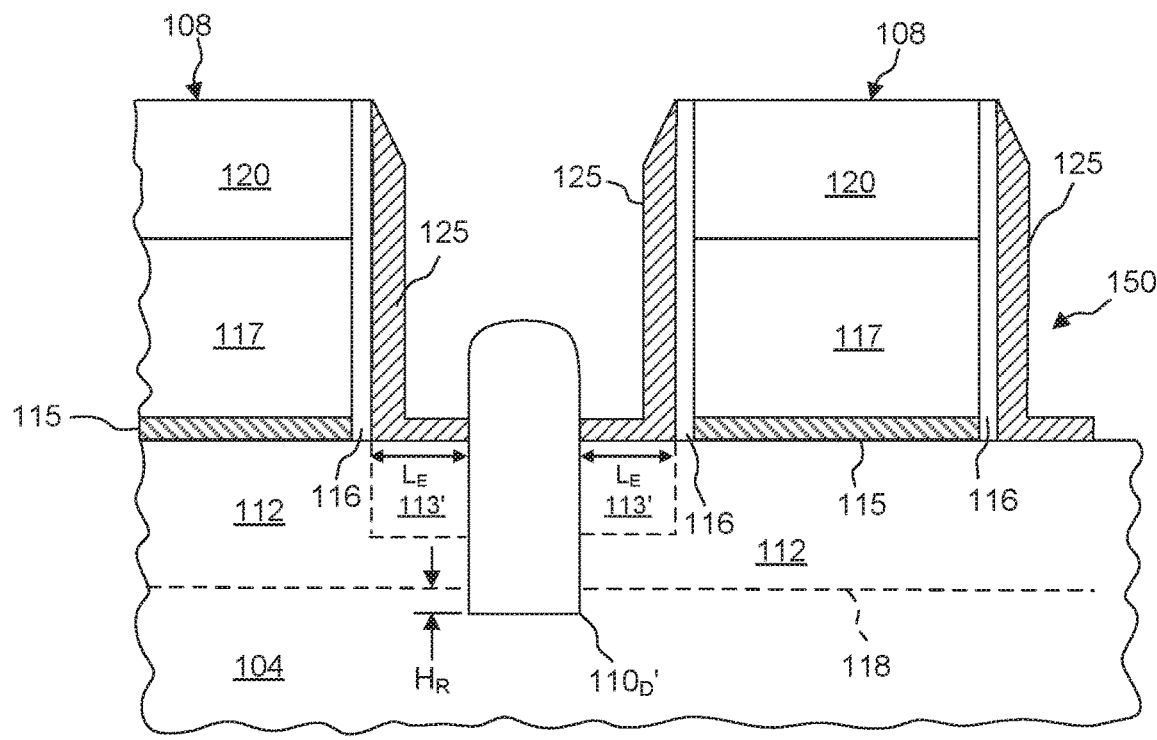

After recess 127 is formed, an epitaxial material is grown in recess 127 to form doped S/D regions, $110_D'$ and $110_S'$ respectively. Doped S/D regions $110_D'$ and $110_S'$ are located right next to partial LDD region 113'. For ease of description, a first one of the pair of doped S/D terminals is referred to as a source region $110_S'$ and a second one of the pair of doped S/D terminals is referred to as a drain region $110_D'$. The dopants in the doped S/D regions $110_D'$ and $110_S'$, could diffuse into and dope the LDD regions 113 during annealing. FIG. 2E shows that epitaxial material is grown in recess 127 to form doped drain regions $110_D'$. Doped source region $110_S'$ is not shown in FIG. 2E. At least a portion of each doped S/D region $110_D'$ and $110_S'$ is formed in recesses 127, and therefore is also self-aligned with the opening formed by epi-block region 126.

Figure 3A:
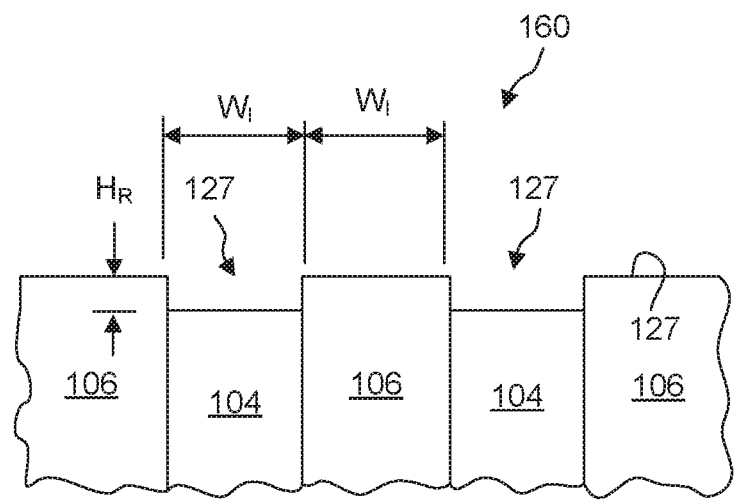
FIGS. 3A and 3B show cross-sectional views of the epitaxial growth of doped source and drain regions in an example transistor region, in accordance with some embodiments.
Figure 3B:
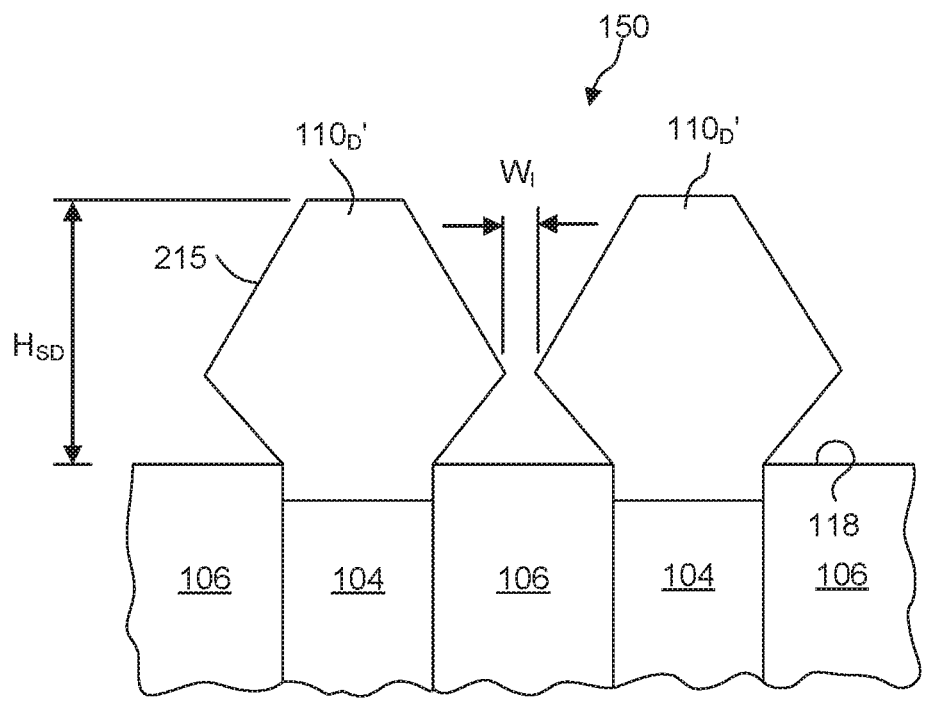

In some embodiments, the epitaxial material filling recesses 127 to form doped S/D regions, $110_D'$; and $110_S'$, is a silicon-containing material 215 (as shown in FIG. 3B). In some embodiments, the epitaxially-grown silicon-containing material 215 is formed by an epitaxial deposition/partial etch process, which repeats the epitaxial deposition/partial etch process at least once. Such repeated deposition/partial etch process is also called a cyclic deposition-deposition-etch (CDDE) process. The deposition process forms a thin epitaxial layer of silicon-containing material in recess 127 and an amorphous silicon-containing material on non-crystalline surfaces. An etching (or partial etching) process removes the amorphous silicon-containing material and also a portion of the silicon-containing material in recesses 127. The remaining silicon-containing material 215 is formed in each of recesses 127.

Deposition of silicon-containing material 215 includes in-situ doping of silicon-containing material 215. For example, forming an n-type transistor can use an n-type doping precursor, e.g., phosphine ($PH_3$) and/or other n-type doping precursors. By using the in-situ doping process, the dopant concentration of silicon-containing material 215 can be desirably controlled and achieved. In some embodiments, silicon-containing material 215 can be an n-type doped silicon layer that is doped with phosphorus (Si:P). In some embodiments, silicon-containing material 215 can be an n-type doped silicon layer that is doped with both phosphorus and carbon (Si:CP). Carbon could impede the out-diffusion of phosphorus from silicon-containing material 215. Other types of dopants may also be included. In some embodiments, the phosphorus dopant has a concentration in a range from about 7E20 atoms/$cm^3$ to about 3E21 atoms/$cm^3$. In some embodiments, the carbon dopant has a concentration in a range from about 0.1% to about 5% (atomic percent).

In some embodiments, silicon-containing material 215 can be formed by chemical vapor deposition (CVD), e.g., low pressure CVD (LPCVD), atomic layer CVD (ALCVD), ultrahigh vacuum CVD (UHVCVD), plasma-enhanced CVD (PECVD), remote plasma CVD (RPCVD), any suitable CVD; molecular beam epitaxy (MBE) processes; any suitable epitaxial process; or any combinations thereof.

In some embodiments, the etching process can use an etching gas including at least one of hydrogen chloride (HCl), chlorine ($Cl_2$), other suitable etching gases, and/or any combinations thereof. The etching process would remove the amorphous silicon-containing material over non-crystalline surface at a rate higher than the removal rate of epitaxial silicon-containing material 215. Therefore, only epitaxial film remains on the substrate surface after a CDDE cycle. The epitaxial deposition/partial etch process is repeated a number of times until a desired thickness is reached. As a result, such repeated deposition/partial etch process is called a cyclic deposition-deposition-etch (CDDE) process.

Silicon-containing material 215 in recesses 127 is epitaxial. Uniform growth of a high-quality epitaxial layer can be affected by the dimensions of recess 127. In general, it is challenging to uniformly grow high quality epitaxial material over large surface areas. As surface area increases, control over lattice orientation during growth becomes increasingly difficult. Therefore it is desirable to form an optimum size of recess 127 for the suitable deposition process. According to some embodiments, the size of recess 127 can be changed at least by adjusting its width. In some embodiments, adjacent epi block regions 126 are separated by horizontal length $L_W$. $L_W$ is also the width of recess 127 and doped S/D terminals $110_D'$ and $110_S'$. This separation $L_W$ can be changed by adjusting length $L_E$ of epi block region 126, according to some embodiments. Separation $L_W$ can also be changed by adjusting the separation of adjacent gate structures 108, according to some embodiments. Separation $L_W$ can also be changed by adjusting both length $L_E$ of epi block region 126 and separation of adjacent gate structures 108, according to some embodiments. The designs of epi block region 126 and gate structure 108 can be performed through Boolean operations during reticle design, and the desired dimensions of epi block region 126 and gate structure 108 can be achieved by the deposition/etch process. No additional fabrication steps are required.

Subsequent to the formation of $110_D'$ and $110_S'$, epi block layer 125 is removed by any suitable processes. In some embodiments when epi block layer 125 is silicon nitride, it may be removed by a wet etching process using hot $H_3PO_4$. In some embodiments, epi block layer 125 may be removed by a wet etching process, for example, by dipping the substrate in hydrofluoric acid (HF) or heated photoresist remover. In another embodiment, epi block layer 125 may be removed by reactive ion etch (RIE) and/or other suitable dry etching processes.

FIG. 3A shows a cross-sectional view of transistor region 150 after the formation of recess 127 and before the epitaxial growth of doped S/D regions, $110_D'$ and $110_S'$, according to the cut 132 illustrated in FIG. 1A. FIG. 3A shows recesses 127 in two neighboring recessed fins 104 separated (or isolated) from each other by an isolation structure 106. Each of the two neighboring recessed fins 104 has isolation structures 106 on both sides.

FIG. 3B shows cross-sectional views of doped source/drain regions $110_D'$ formed by the CDDE process described above. The growth rate of epitaxial Si depends on the crystal orientation. Growth rate is slower on closed-packed {111} planes. Doped source/drain regions $110_D'$ are made of doped silicon-containing material 215, which also forms doped source/drain regions $110_S'$ (not shown in FIG. 3B). In some embodiments, the total thickness of epitaxial silicon-containing material 215 is in a range from about 40 nm to about 50 nm. The height (or thickness) $H_{SD}$ of doped source/drain regions $110_D'$ above surface 118 is in a range from about 35 nm to about 45 nm, in some embodiments. In some embodiments the shortest distance $W_1$ between two neighboring doped drain regions $100_D'$ is in a range from about 10 nm to about 20 nm. Doped source regions $110_S'$ resemble the doped drain regions $110_D'$. The description above for doped drain regions $110_D'$ also applies for doped source regions $110_S'$.

A cleaning process may be performed to prepare the surface for S/D contact formation (e.g., S/D silicide formation). Subsequent processing may form various contacts/vias/lines and multilayer interconnect features (e.g., metal layers and interlayer dielectrics) on substrate 102, configured to connect the various features or structures of semiconductor device structure 100. The additional features may provide electrical interconnection to the device including the formed gate structures. For example, a multilayer interconnection includes vertical interconnects, such as vias or contacts, and horizontal interconnects, such as metal lines. The various interconnection features may be implemented with various conductive materials including copper, tungsten, and/or silicide.

Source/drain resistance in semiconductor device structure 100 can be increased by suitably adjusting device parameters. A semiconductor device having increased S/D resistance provides improved breakdown characteristics, such as high breakdown voltage and low reverse current. The increased S/D resistance also significantly reduces the semiconductor device structure's susceptibility to latch-up. In some embodiments, S/D resistance can be tuned by adjusting length $L_E$ of epitaxial block region 126. Doped source/drain regions $110_D'$ and $110_S'$ are located right next to LDD regions 113, which are between channel regions 112 and source/drain regions $110_D'$, $110_S'$. Epitaxial block region 126 protects a portion of LDD region 113 during the recess etching process, effectively extending the horizontal separation between channel regions 112 and source/drain regions $110_D'$, $110_S'$, which results in an extended length of LDD region 113. As the horizontal separation between source/drain regions $110_D'$ and $110_S'$ increases due to the extended LDD region 113, separation between source/drain regions increase, and S/D resistance increases accordingly.

In some embodiments, S/D resistance can be tuned by creating a desired doping profile in the LDD region and/or source/drain regions. For example, the S/D resistance can be adjusted by tuning the dopant concentration of LDD regions 113 and S/D regions $110_D'$ and $110_S'$. A lower dopant concentration in LDD regions 113 would result in higher resistivity, and therefore increased S/D resistance. Similarly, a higher dopant concentration would result in lower S/D resistance.

Figure 4:
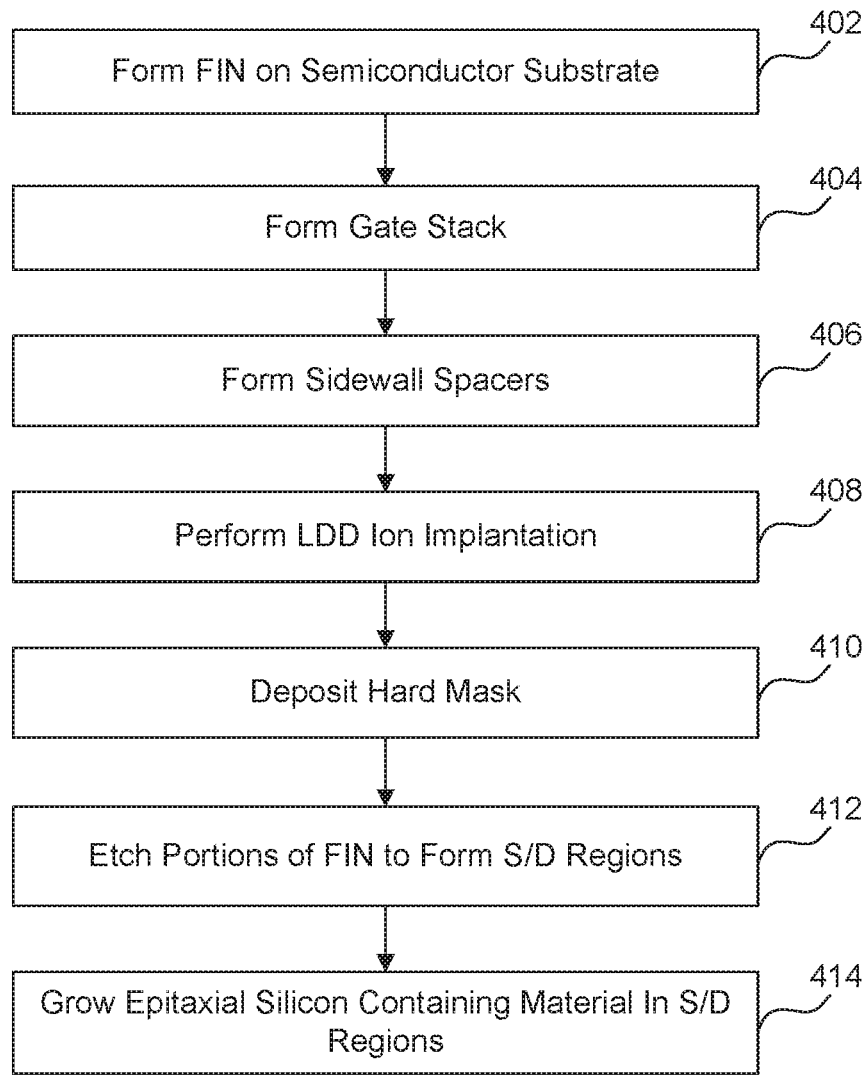
FIG. 4 is a flow diagram illustrating a method, according to an embodiment.

FIG. 4 is a flow diagram of an illustrative method 400, of forming S/D structures having greater S/D resistance as compared to conventional S/D structures. Other fabrication steps may be performed between the various steps of method 400, and are omitted here merely for clarity.

Method 400 begins with a semiconductor substrate. For example, the semiconductor substrate is a bulk Si wafer. Alternative embodiments may use other semiconductor materials. Method 400 includes operation 402, patterning a semiconductor substrate to form a fin. The fin is vertical, i.e., it is nominally perpendicular to the surface of the substrate, and the fin may be rectangular or trapezoidal. In some embodiments the fin may have rounded corners where its top surface and sidewalls meet. The fin may be formed using a variety of dry etch techniques such as reactive ion etching or inductively coupled plasma etching.

Method 400 continues with operation 404, forming a gate stack on the fin, the gate stack having a first sidewall and a second sidewall. Forming the gate stack includes forming a gate dielectric on the fin, and then forming a gate electrode over the gate dielectric. Examples of gate dielectrics include, but are not limited to, one or more of silicon dioxide, silicon nitride, and high-k dielectric materials. The gate electrode may include a stack of various metal and metal alloy layers, or polysilicon.

Method 400 continues with operation 406, forming a first sidewall spacer adjacent to the first sidewall, and a second sidewall spacer adjacent to the second sidewall. The first and second sidewall spacers are typically formed at the same time by an etch-back process. In alternative embodiments the first and second sidewall spacers may be formed of two or more layers of material.

Method 400 continues with operation 408, performing LDD ion implantation on substrate 102 to dope LDD regions 113. LDD regions 113 are formed in the fin structure between adjacent spacers 116. An ion implant process is performed to form LDD regions 113, and may utilize any suitable doping species. After the dopant ions are implanted, a thermal anneal is performed to drive in and to activate the dopants.

Method 400 continues with operation 410, forming an epi block layer having an epi block region to protect a portion of the LDD region during the recess etching process. Epi block region may be comprised of silicon nitride, SiON, SiC, SiOC, spin-on glass (SOG), a low-k film, tetraethoxysilane (TEOS), plasma enhanced CVD oxide (PE-oxide), high-aspect-ratio-process (HARP) formed oxide, photoresist layer, and/or other suitable material.

Method 400 continues with operation 412, etching exposed portions of the fin. In order to prepare the fin for the formation of S/D structures, exposed portions of the fin, i.e., those not protected by the patterned epi block layer are removed typically by etching. These exposed portions of the fin are those portions that are not covered by the gate stack or are not covered by the patterned epi block layer. Because the gate stack and the patterned epi block layer act as masking materials, they protect the fin underneath them from etching. This etching process may continue until the etched portions of the fin are recessed below the neighboring isolation material. This exposed recessed interface acts as a nucleation site for subsequent epitaxial growth of silicon-containing compounds, according to an embodiment.

Method 400 continues with operation 414, growing silicon-containing material on the recessed interface to form source/drain regions. The silicon-containing material may be formed by an epitaxial deposition/partial etch process. The deposition process forms a thin epitaxial layer of silicon-containing material in recess 127 and an amorphous silicon-containing material on non-crystalline surfaces. An etching (or partial etching) process removes the amorphous silicon-containing material and also a portion of the silicon-containing material in recesses 127. The remaining silicon-containing material 215 is formed in each of recesses 127.

One benefit of finFET S/D structures in accordance with this disclosure is that, even though the S/D resistance is greater than conventional finFET S/D structures, there are no layout design rule or process step changes that are needed. That is, the layout design rules and process steps for finFET S/D structures with the patterned epi block layer in accordance with this disclosure are the same as the layout design rules and process steps for finFET S/D structures without epi block region.

In one embodiment, a semiconductor structure includes an extended LDD region formed on finFET S/D structure. Epi block regions are disposed between two adjacent gate structures. An epi block region is adjacent to a first edge of a transistor gate structure and is disposed over a portion of the LDD region of the fin. The epi block region protects the covered portion of the LDD region during subsequent fin etching processes, and the covered LDD region provides for an extended LDD region. In this illustrative embodiment, the extended LDD regions provide extra separation between source/drain regions, and S/D resistance may be tuned by adjusting the length of epi block regions. The S/D resistance may also be tuned by selecting desired doping profiles for the LDD and S/D regions. The length of epitaxial block regions may also be adjusted to maintain high uniformity epitaxial growth of the S/D regions.

In another embodiment, a method of forming a semiconductor structure with increased S/D resistances includes (a) forming a fin on a semiconductor substrate, (b) forming a gate stack on the fin, the gate stack having a first sidewall and a second sidewall, (c) forming a first sidewall spacer adjacent the first sidewall, and a second sidewall spacer adjacent the second sidewall, (d) forming a (lightly-doped-drain) LDD region by doping the exposed fin region, (e) forming an epi block layer having an epi block region, wherein the epi block region covers a portion of the LDD region, (f) forming recesses in the LDD region of the fin by etching portions of the fin not covered by the gate stack or not covered by the epi block layer, (g) epitaxially growing silicon-containing material in the etched recesses of fin to form S/D structures. In this illustrative embodiment, S/D resistance may be tuned by adjusting the length of epi block regions, and may also be tuned by selecting a desired doping profile for the LDD and S/D regions. The length of epi block regions may also be adjusted to maintain high uniformity of epitaxial growth in the S/D regions.

It is to be appreciated that the Detailed Description section, and not the Abstract of the Disclosure section, is intended to be used to interpret the claims. The Abstract of the Disclosure section may set forth one or more but not all exemplary embodiments and thus, is not intended to limit the subjoined claims.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of its teachings and guidance.

The breadth and scope of the present disclosure should not be limited by any of the above-described exemplary embodiments, but should be defined only in accordance with the following claims and their equivalents.

What is claimed is:

1. A semiconductor structure, comprising:
    a substrate;
    a first gate electrode stack comprising:
        a first gate dielectric disposed at a first location on the substrate;
        a first gate electrode disposed on the first gate dielectric, the first gate electrode having a first sidewall and an opposing second sidewall;
        a first spacer disposed along the first sidewall of the first gate electrode; and
        a second spacer disposed along the second sidewall of the first gate electrode;
    a second gate electrode stack comprising:
        a second gate dielectric disposed at a second location on the substrate;
        a second gate electrode disposed on the second gate dielectric, the second gate electrode having a third sidewall and an opposing fourth sidewall;
        a third spacer disposed along the third sidewall of the second gate electrode; and
        a fourth spacer disposed along the fourth sidewall of the second gate electrode, wherein the second sidewall and the third sidewall face each other, and the second spacer and the third spacer face each other;
    a first source/drain region disposed in the substrate and between the second and third spacers, wherein the first source/drain region does not abut the second and third spacers and a width of the first source/drain region is between about 50 nm and about 350 nm; and a lightly-doped drain (LDD) region abutting the first source/drain region and aligned with the second spacer, wherein a width of the LDD region is between about 50 nm and about 150 nm.

2. The semiconductor structure of claim 1, further comprising a fin, wherein the first source/drain region is disposed at least partially in the fin.

3. The semiconductor structure of claim 2, wherein the substrate comprises a bulk silicon wafer and the fin is disposed on the bulk silicon wafer.

4. The semiconductor structure of claim 1, further comprising a first patterned hardmask structure and a second patterned hardmask structure disposed on the substrate.

5. The semiconductor structure of claim 4, wherein the first patterned hardmask structure abuts the second spacer and the first source/drain region.

6. The semiconductor structure of claim 4, wherein the second patterned hardmask structure is configured to abut the third spacer and the first source/drain region.

7. The semiconductor structure of claim 1, further comprising a second source/drain region disposed in the substrate, wherein the second source/drain region does not abut the fourth spacer.

8. The semiconductor structure of claim 1, wherein a horizontal length between the first source/drain region and the second spacer is between 50 nm and 150 nm.

9. A semiconductor structure, comprising:
a first gate electrode having a first sidewall and a second side wall opposite to the first sidewall;
first and second spacers respectively disposed along the first and second sidewalls of the first gate electrode;
a second gate electrode having a third sidewall and a fourth sidewall opposite to the third sidewall, wherein the second and third sidewalls face each other;
third and fourth spacers respectively disposed along the third and fourth sidewalls of the second gate electrode;
a source/drain region comprising a first width between about 50 nm and about 350 nm disposed in a substrate, wherein the source/drain region is spaced apart from the second spacer and the third spacer by a second width that is between about 50 nm and about 150 nm;
a blocking layer comprising a first portion and a second portion, wherein:
the first portion extends in a vertical direction and is formed along a sidewall of the second spacer; and
the second portion extends in a horizontal direction and in contact with the source/drain region;
a first lightly-doped drain (LDD) region abutting the source/drain region and aligned with the second spacer, wherein the first LDD region comprises a third width that is between about 50 nm and about 150 nm; and
a second LDD region abutting the source/drain region and aligned with the third spacer.

10. The semiconductor structure of claim 9, further comprising a fin, wherein the source/drain region is disposed in the fin.

11. The semiconductor structure of claim 9, further comprising a fin protruding from an isolation structure, wherein a bottom surface of the source/drain region is below a top surface of the isolation structure.

12. The semiconductor structure of claim 9, wherein the source/drain region comprises a doped epitaxial material.

13. The semiconductor structure of claim 9, wherein a horizontal length between the source/drain region and the second spacer is between 50 nm and 150 nm.

14. A semiconductor structure, comprising:
a first gate structure disposed on a substrate, wherein the first gate structure comprises first and second sidewalls;
first and second spacers disposed along the first and second sidewall;
a second gate structure disposed on the substrate, wherein the second gate structure comprises third and fourth sidewalls, wherein the third side wall is opposing the second sidewall of the first gate structure;
third and fourth spacers respectively disposed along the third and fourth sidewalls;
a source/drain region disposed in the substrate and does not abut the second spacer or the third spacer, wherein:
the source/drain region comprises a first width between about 50 nm and about 350 nm; and
a horizontal length between the source/drain region and the second or third spacer is between 50 nm and 150 nm; and
first and second lightly-doped drain (LDD) regions comprising a second width disposed in contact with the source/drain region, wherein the first and second LDD regions are respectively aligned with the first and second spacers and the second width is between about 50 nm and about 150 nm.

15. The semiconductor structure of claim 14, wherein the substrate comprises a fin and the source/drain region is disposed in the fin.

16. The semiconductor structure of claim 14, wherein a ratio of the first width over the second width is between about 1 and about 7 and 150 nm.

17. The semiconductor structure of claim 14, wherein the source/drain region comprises a doped epitaxial material.

* * * * *